(12) United States Patent
Bijkerk et al.

(10) Patent No.: US 6,452,194 B2
(45) Date of Patent: Sep. 17, 2002

(54) RADIATION SOURCE FOR USE IN LITHOGRAPHIC PROJECTION APPARATUS

(75) Inventors: Frederik Bijkerk, Amsterdam (NL); Henryk Fiedorowicz, Warszawa (PL); Cornelis C. de Bruijn, Sprundel (NL); Andrzej Bartnik, Warszawa (PL); Konstantin N. Koshelev, Troitzk (RU); Vadim Y. Banine, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/735,641

(22) Filed: Dec. 14, 2000

Related U.S. Application Data

(63) Continuation-in-part of application No. 09/466,217, filed on Dec. 17, 1999.

(30) Foreign Application Priority Data

Jul. 3, 2000  (EP) .............................. 00202304

(51) Int. Cl.[7] .............................. G21K 5/10; H01J 37/08
(52) U.S. Cl. .................................. 250/492.2; 378/119
(58) Field of Search ................. 378/119; 315/111.21; 372/76; 250/492.2, 504 R

(56) References Cited

U.S. PATENT DOCUMENTS

| | | |
|---|---|---|
| 4,494,043 A | 1/1985 | Stallings et al. |
| 4,635,282 A | 1/1987 | Okada et al. |
| 4,663,567 A | 5/1987 | Wong |
| 4,771,447 A | 9/1988 | Saitoh et al. |
| 5,577,092 A | 11/1996 | Kublak et al. |
| 5,763,930 A | 6/1998 | Partlo |
| 6,002,744 A | * 12/1999 | Hertz et al. ............. 378/119 |
| 6,065,203 A | 5/2000 | Haas et al. |
| 6,105,885 A | 8/2000 | Haas et al. |

FOREIGN PATENT DOCUMENTS

WO  WO 99/34395  7/1999

OTHER PUBLICATIONS

Characterization and optimization of a laser–produced X–ray source with a gas puff target, Henryk Fiedorowicz et al, SPIE vol. 3767. 0277–786X99, Denver Colorado, Jul. 1999, pp. 10–20.

Microlithography, Part of SPIE's Thematic Applied Science and Engineering Series, Mar. 14–19, 1999 Santa Clara Convention Center and Westin Hotel, Santa Clara, California USA. H. Fiedorowicz et al.

Baksht et al., "Electromagnet Valve for a Multilayer–Puff Nozzle," *Instruments and Experimental Techniques* 41(4):536–538 (1988).

Sze et al., "Initial results of an argon Z pinch using a double–shell gas puff," *Physics of Plasma* 7(10):4223–4226 (2000).

A copy of European Search Report issued in the corresponding European application.

* cited by examiner

*Primary Examiner*—Jack Berman
*Assistant Examiner*—Johnnie L Smith, II
(74) *Attorney, Agent, or Firm*—Pillsbury Winthrop LLP

(57) ABSTRACT

A radiation source of a radiation system of a lithographic projection apparatus comprises electrodes for creating a discharge in a space between them such that the discharge collapses into a pinch volume. The collapsing discharge creates a highly ionized, high temperature plasma in the pinch volume. A working fluid is ejected from a jet nozzle into the pinching volume and is thereby raised to a high temperature state and emits extreme ultraviolet radiation.

23 Claims, 4 Drawing Sheets

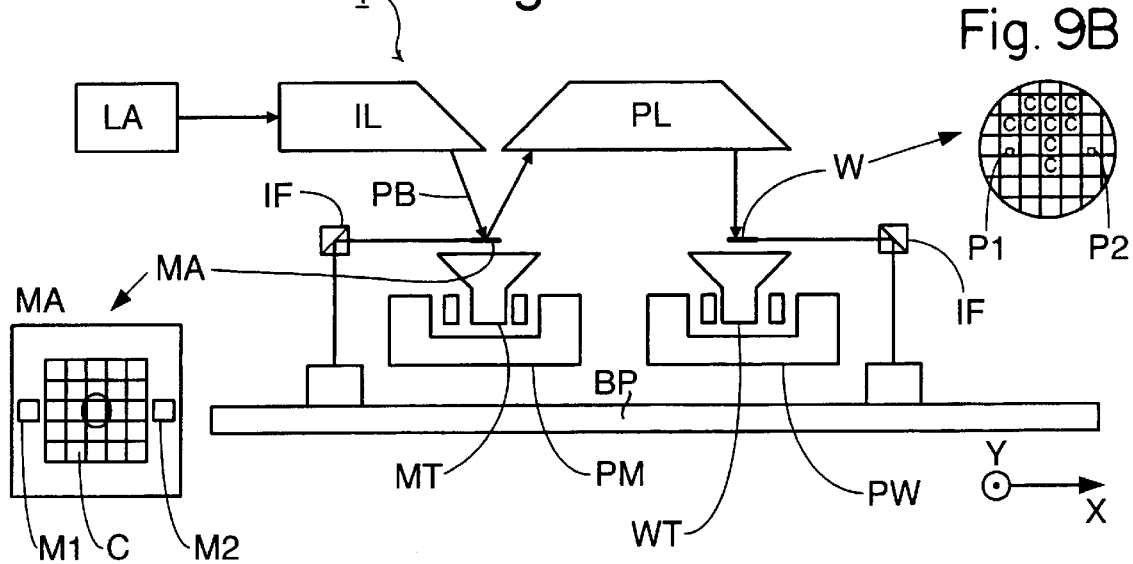

RADIATION SOURCE FOR USE IN LITHOGRAPHIC PROJECTION APPARATUS

This is a Continuation-in-Part of National Application Ser. No. 09/466,217 filed Dec. 17, 1999.

BACKGROUND OF THE INVENTION

1. Field of the Invention

The present invention relates to radiation sources, particularly discharge plasma sources emitting EUV radiation such as may be used as the radiation source of a lithographic projection apparatus comprising:

- a radiation source constructed and arranged to generate extreme ultraviolet radiation;
- an illumination system constructed and arranged to receive said extreme ultraviolet radiation and to supply a projection beam of said extreme ultraviolet radiation;
- patterning means constructed and arranged to pattern the projection beam according to a desired pattern;
- a substrate table constructed to hold a substrate; and
- a projection system constructed and arranged to image the patterned beam onto target portions of the substrate.

2. Description of the Related Art

The term "patterning means" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning means include:

A mask table for holding a mask. The concept of a mask is well known in lithography, and its includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired;

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference; and A programmable LCD array. An example of such a construction is given in U.S. Pat. No. 5,229,872, which is incorporated herein by reference. For purposes of simplicity, the rest of this text may, at certain locations, specifically direct itself to examples involving a mask table and mask; however, the general principles discussed in such instances should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics and catadioptric systems, for example. Further, the lithographic apparatus may be of a type having two or more mask tables and/or two or more substrate tables.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target area (comprising one or more dies) on a substrate (silicon wafer) which has been coated with a layer of radiation-sensitive material (resist). In general, a single wafer will contain a whole network of adjacent target areas which are successively irradiated via the mask, one at a time. In one type of lithographic projection apparatus, each target area is irradiated by exposing the entire mask a pattern onto the target area at once such an apparatus is commonly referred to as a wafer stepper. In an alternative apparatus, which is commonly referred to as a step-and-scan apparatus, each target area is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned from International Patent Application WO 97/33205.

In general, apparatus of this type contained a single mask (first object) table and a single substrate (second object) table. However, machines are becoming available in which there are at least two independently moveable substrate tables; see, for example, the multi-stage apparatus described in International Patent Applications WO 98/28665 and WO 98/40791. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughout, which in turn improves the cost of ownership of the machine.

In a lithographic apparatus the size of features that can be imaged onto the substrate is limited by the wavelength of the projection radiation. To produce integrated circuits with a higher density of devices, and hence higher operating speeds, it is desirable to be able to image smaller features. Whilst most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray and possible sources include, for instance, laser-produced plasma sources, discharge plasma sources, or synchrotron radiation from electron storage rings. An outline design of a lithographic projection apparatus using synchrotron radiation is described in "Synchrotron radiation sources and condensers for projection x-ray lithography", JB Murphy et al, Applied Optics Vol. 32 No. 24 pp. 6920-6929 (1993). Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc SPIE 3997, pp. 136-156, 2000; M. W. McGeoch, "Power Scaling of a Z-pinch Extreme Ultraviolet Source", Proc SPIE 3997, pp. 861-866, 2000; and W. T. Silfvast, M. Klosner, G. Shimkaveg, H. Bender, G. Kubiak, N. Fornaciari, "High-power plasma discharge source at 13.5 and 11.4 nm for EUV lithography", Proc SPIE 3676, pp. 272-275, 1999.

In a discharge plasma source, a partially ionized, low-density and relatively cold plasma is formed by an electrical discharge and then compressed so that it becomes highly ionized and reaches a very high temperature, causing the emission of EUV radiation. Preionization by, for instance, a source of RF power may be employed to start the discharge and to possibly create a well-defined plasma sheet. The geometry of devices, such as plasma focus, Z-pinch and capillary sources, may vary, but in each of these types a magnetic field generated by the electrical current of the discharge drives the compression. It is essential to optimize the efficiency and intensity of a discharge plasma source because there are few gases which have appropriate magneto-hydrodynamic properties to form a plasma which can be sufficiently compressed and which also emit a sufficiently large amount of radiation in the desired frequency band.

SUMMARY OF THE INVENTION

It is an object of the present invention to provide an improved plasma source that may be used in a lithographic projection apparatus.

According to the present invention there is provided a plasma radiation source for extreme ultraviolet electromagnetic radiation comprising:

electrodes connected to a source of high electrical potential and constructed and arranged to allow a first plasma state to compress into a pinch volume by an electrical current induced in said first plasma state and a corresponding magnetic field;

a supply for a working fluid to be brought into a high-temperature plasma state to emit extreme ultraviolet electromagnetic radiation; and a primary jet nozzle constructed and arranged to eject said working fluid into said pinch volume so as to be brought into said high-temperature plasma state by compression of said first plasma state into said pinch volume.

Because the EUV radiation is principally emitted by the working (primary) fluid, which is raised to a high-temperature, radiation-emitting state by the compressing discharge, the working fluid can be chosen for its efficiency in emitting EUV radiation at the desired wavelength, without being limited by the need for properties favorable to forming a discharge. The working fluid may be, for example, Li vapor, Krypton, Xenon, water and cryogenic liquids. At the same time, a driver fluid, chosen on the basis of its magneto-hydrodynamic properties to be effective at generating a conducting and effective compression medium, and on the basis of its EUV optical properties, particularly its transmissivity at the wavelength(s) of interest, can be supplied to the space between the electrodes to assist in formation of the discharge. The plasma generating requirements and the emission requirements are therefore decoupled, allowing a wider choice of substance for each component and enabling improvements in the effectiveness and efficiency of the source.

The provision of fresh working fluid for each discharge ("shot") of the source also increases the possible repetition rate of the source by allowing the initial state to be reached more quickly each cycle. The fresh supply of working fluid also serves to flush pollution from the pinch volume, which takes time in the prior art sources. Further more, a greater amount of the working fluid may be supplied for each discharge since it can be supplied in a more dense form, such as a cluster or liquid jet.

The density of the working fluid on the emitting axis can be increased by suitable arrangement of the primary jet so that the ejected fluid has its highest density on the emitting axis. A supersonic jet is particularly preferred as it provides a jet with a sharply peaked density profile.

In a preferred embodiment of the invention, the radiation source may further comprise:

a supply for a secondary fluid; and a secondary jet nozzle constructed and arranged to eject said secondary fluid parallel to and spaced from the line of ejection of said working fluid.

By having a secondary jet nozzle beside the primary jet nozzle the degree of divergence of the primary gas may be decreased by the outflow of the secondary gas from the secondary jet nozzle. Since a sufficient density in the primary gas will then be present at a larger distance from the jet nozzle outlet, the plasma can thus be created at the larger distance from the nozzle outlet. This prevents the production of debris and its associated problems. Further, the radiation source may be positioned such that the outflow of secondary gas will function as a shield, for instance, between optical elements of the illumination system and parts, such as electrodes and insulators, of the source on the one hand and the high-temperature plasma created on the other hand. Such a shield will largely prevent the escape of debris particulates towards source parts or optical elements. The particulates do not pass the screening secondary gas or are slowed down and neutralised and are prevented from causing damaging effects by deposition or otherwise. Also, a radiation source having a reduced re-absorption of emitted radiation and an increased brightness may be obtained by providing for an XUV radiation transparent volume at sides of the pinch volume.

In an especially preferred embodiment, the secondary jet nozzle encloses the primary jet nozzle. In such a case, the secondary nozzle can be annular in shape or comprise a plurality of nozzles arranged to surround the primary nozzle. Such a configuration will yield an even better control over the divergence of the primary gas, and an outflow of the primary gas which is parallel or even convergent over a certain distance from the nozzle outlet can be obtained. The secondary gas enclosing the primary gas and a high-temperature plasma created therein also further prevents the escape of plasma particulates from the plasma and provides for an XUV radiation transparent volume around the pinch volume. In an optimal configuration, the primary and secondary jet nozzles are co-axial.

It should be noted that the secondary nozzle may provide an initial quantity of the secondary gas to assist the initial discharge formation and may then cease to supply gas. Alternatively the secondary gas can be supplied continuously or in pulses to perform the functions described above.

The secondary gas may comprise at least one gas selected from the group comprising helium, neon, argon, krypton, methane, silane and hydrogen or, in general, any EUV transparent gas. Hydrogen is a preferred secondary gas since it has superior absorption characteristics with respect to EUV radiation. It may thus be used in a large flow rate (high local density in the outflow), yielding a very efficient confinement of the primary gas for divergence control and screening of the plasma.

The present invention also provides a lithographic projection apparatus for imaging of a mask pattern in a mask onto a substrate, said apparatus comprising:

a radiation source constructed and arranged to generate extreme ultraviolet radiation;

an illumination system constructed and arranged to receive said extreme ultraviolet radiation and to supply a projection beam of said extreme ultraviolet radiation;

patterning means constructed and arranged to pattern the projection beam of radiation according to a desired pattern;

a substrate table constructed to hold a substrate; and a projection system constructed and arranged to image the patterned beam onto target portions of the substrate; characterized in that:

said radiation source is as described above.

The present invention further provides device manufacturing method using a lithography apparatus comprising:

a radiation source constructed and arranged to generate extreme ultraviolet radiation;

an illumination system constructed and arranged to receive said extreme ultraviolet radiation and supply a projection beam of said extreme ultraviolet radiation;

patterning means constructed and arranged to pattern the projection beam of radiation according to a desired pattern;

a substrate table constructed to hold a substrate; and a projection system constructed and arranged to image the patterned beam onto target portions of the substrate; the method comprising the steps of:

providing a projection beam of radiation using said radiation source;

providing a substrate that is at least partially covered by a layer of radiation-sensitive material to said substrate table;

patterning the projection beam in its cross-section according to a desired pattern;

imaging the patterned beam onto said target portions of said substrate; characterized by the step of:

using a radiation source as described above as said radiation source.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion" or "exposure area", respectively.

BRIEF DESCRIPTION OF THE DRAWINGS

The present invention and its attendant advantages will be described below with reference to exemplary embodiments and the accompanying schematic drawings, in which:

FIG. 9 depicts a lithographic projection apparatus in which radiation sources according to the invention can be used.

In the various drawings, like parts are indicated by like references.

DETAILED DESCRIPTION OF THE EMBODIMENTS

Embodiment 1

Figure 1:
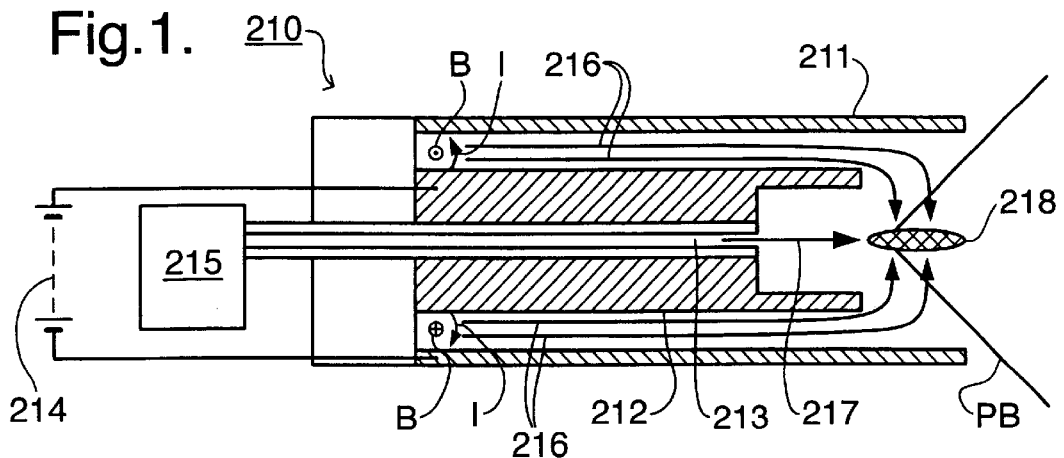
FIG. 1 shows a plasma focus source forming a radiation source according to a first embodiment.

FIG. 1 shows a plasma focus discharge source 210 according to a first embodiment of the present invention. The plasma focus discharge source 210 comprises a generally cylindrical cathode 211 surrounding an elongate anode 212 with an annular space therebetween. A voltage source 214 applies a high voltage between the anode and cathode sufficient to cause ionization of the gas in the annular space so that a discharge current I begins to flow radially from anode to cathode. The discharge current I generates a circular magnetic field B in the annular space between anode and cathode. The ions of the discharge current are driven by their interaction with the magnetic field B along the anode 212, as indicated by arrows 216. The anode 212 is shorter than the cathode 211 and has a hollow tip so that the plasma is driven over the end of the anode 212 and converges to form a very hot plasma in pinch volume 218.

According to the invention, the plasma is formed in a driver gas which fills the annular space between anode 212 and cathode 211 between each discharge. The driver gas is chosen according its magneto-hydrodynamic properties to effectively form a conducting medium, guiding the current from anode to cathode, and, induced by the thus generated magnetic field, comprising the enclosed volume around and onto the axis. To provide EUV radiation of the desired wavelength, a working (primary) substance, e.g. gas, vapor, clusters or liquid, is provided into the enclosed volume and is heated by the converging plasma to emit EUV radiation. The working substance is chosen for its efficiency in emitting EUV radiation at the desired wavelength, e.g. about 9 to 16 nm, preferably 11 or 13 nm, and may be Li, Xe or water.

The working substance is preferably emitted into the region of the pinch volume 218 of the converging plasma as a jet, e.g. a cluster jet or a droplet-like jet, appropriately timed to the discharge voltage that is derived from an appropriately pulsed source 214. The working substance can be supplied from a source 215 via a bore 213 in the anode 212 to form a jet 217 in the hollow tip of the anode 212. The source 215 comprises a reservoir of the working substance as well as necessary pumps, valves, etc to control the jet.

Embodiment 2

A second embodiment of the invention, which may be the same as the first embodiment of the invention save as described below, comprises a so-called Z-pinch plasma discharge source.

Figure 2:
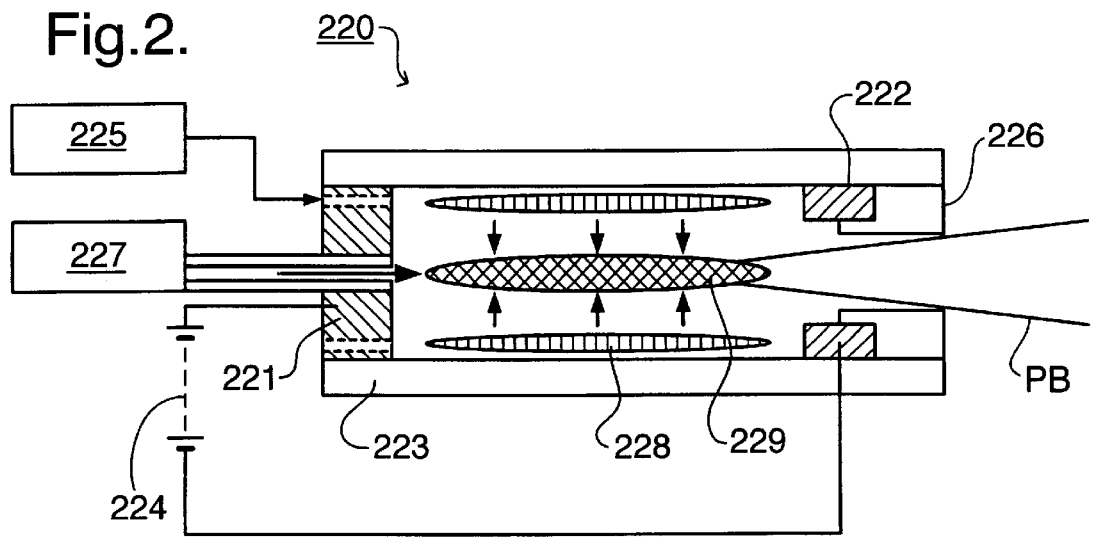
FIG. 2 shows a Z-pinch plasma source forming a radiation source according to a second embodiment of the invention.

The Z-pinch plasma discharge source 220 is shown in FIG. 2. It comprises an annular cathode 221 and annular anode 222 provided at opposite ends of a cylindrical chamber 223 having insulating walls. A quantity of driver (secondary) gas is injected from source 225 through an annular opening close to the outer wall of the cylindrical chamber 223 and pre-ionized. Voltage source 224 then applies a high voltage between anode 222 and cathode 221 causing a cylindrical discharge starting on the insulating walls of the chamber 223 which generates an azimuthal magnetic field. The magnetic field causes the discharge to contract into a thin axial thread, or pinch volume, 229 at high pressure and temperature. Ceramic plug 226 defines the aperture through which the extreme ultraviolet radiation to form projection beam PB is emitted.

To enhance the emission of EUV, according to the invention, a working substance is jetted into the region of the pinch volume 229 in chamber 223 from source 227 at an appropriate time to be entrained with and compressed by the plasma discharge. As in the first embodiment, the driver gas can be chosen for its effectiveness in generating a high-temperature plasma and the working substance for its efficiency in emitting EUV radiation of the desired wavelength.

Embodiment 3

Figure 3:
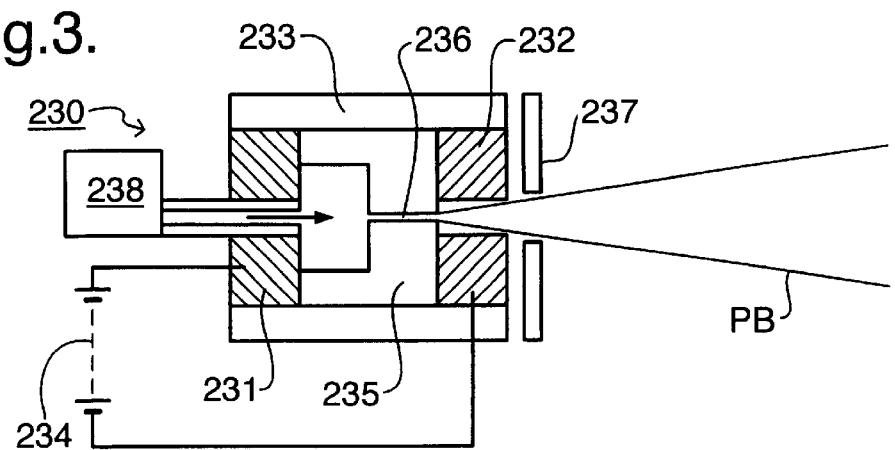
FIG. 3 shows a capillary discharge plasma source forming a radiation source according to a third embodiment of the invention.

A third embodiment, which may be the same as the first embodiment, save as described below, comprises a capillary discharge plasma source. FIG. 3 shows the capillary discharge source 230, which has a cathode 231 and anode 232 forming the end plates of a small chamber 233. The anode 232 has a small central through-hole aligned with a narrow capillary 236 formed in an insulator 235 which covers the side of the anode 232 which faces the cathode 231 and the side walls of the chamber 233. A discharge will be formed in the capillary 236, which, as in the previous embodiments, will compress on the axis of the capillary into a pinch volume to create a highly-ionised, high-density plasma having a high temperature. The emission aperture is defined by aperture plate 237.

According to the invention, a working (primary) substance is jetted into capillary 236 from source 238. As in the previous embodiments, a driver gas can be chosen for its effectiveness in generating a high-temperature plasma and the working substance for its efficiency in emitting EUV radiation of the desired wavelength.

In the third embodiment, and also the first and second embodiments, the driver gas can be injected into the chamber for each discharge (shot) of the source. The working and driver gasses can be ejected, e.g., by a two part annular nozzle, as will be described in the seventh and eight embodiment. This provides for a decreased divergence of the jet of working fluid ejected and for a shielding gas around the pinch volume to increase the efficiency of the source. The primary jet nozzle preferably provides for a supersonic jet to have a sharply-peaked density distribution of the working gas on-axis of the ejection from the jet nozzle.

Embodiment 4

Figure 4:
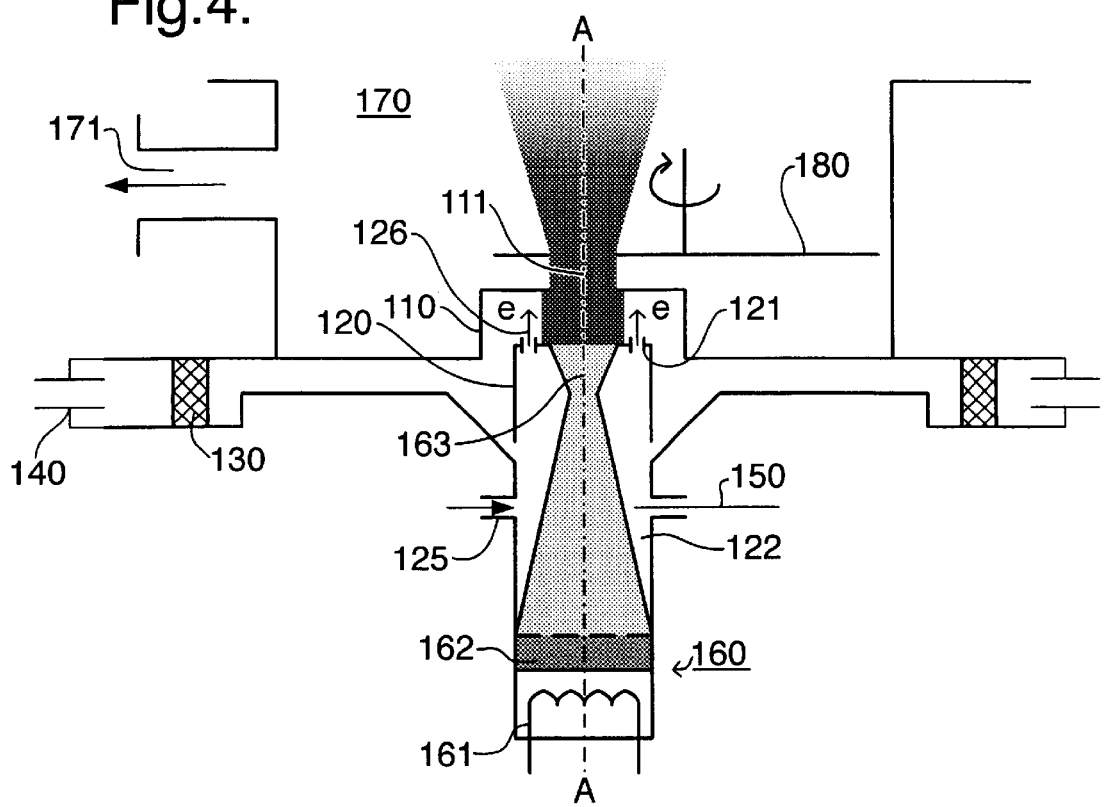
FIG. 4 depicts a radiation source according to a fourth embodiment of the invention.
Figure 8:
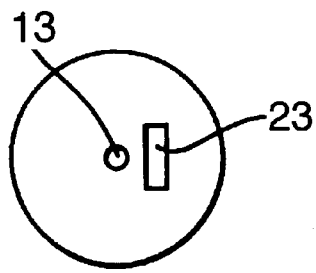
FIG. 8 depicts a front view of the nozzle source according to a variant of the sixth embodiment of the invention.

FIG. 4 shows a fourth embodiment of a radiation source according to the invention, which is a variant of the first embodiment described above. The Figure shows the configuration of anode 110 and cathode 120, which are kept separated by an electrical insulator 130 and which are connected to a capacitor bank 140. A central part of the radiation source has cylindrical symmetry around central axis A. FIG. 8 further shows an annular cathode aperture 121 and an annular cathode cavity 122 around central axis A.

A driver gas or vapor is supplied to cavity 122 via an inlet 125 so as to provide a low pressure within the cavity. In the present embodiment, argon (Ar) is taken as the driver gas, but basically any gas, such as for instance helium (He), neon (Ne) and hydrogen ($H_2$), is suitable. Hydrogen may be specially preferred since it shows a low absorption of radiation in the EUV range. The driver gas inside cavity 122 is used as a source of electrons to start a discharge between anode and cathode.

The cathode cavity 122 surrounds a (primary) working gas or vapor source 160, which ejects a working gas or vapor in the anode-cathode gap in a region around central axis A. The working gas or vapor is chosen for its spectral emission characteristics as a plasma. The present embodiment uses lithium (Li) for its very strong emission line at approximately 13.5 nm. Xenon (Xe) may also be used, which has a broad emission spectrum in the XUV (and EUV) region of the electromagnetic radiation spectrum. The Li source 160 shown comprises a heater 161 below a container 162 containing solid lithium. Vaporized Li reaches the anode-cathode gap through a supersonic (Laval) nozzle 163, however other types of nozzle may also be used.

A trigger electrode 150 is inserted in cathode cavity 122. Electrode 150 is connected to appropriate electrical circuitry (not shown in FIG. 8) for applying a voltage pulse to the electrode to start the discharge described below. Initially, the radiation source is close to auto-triggering. A voltage pulse applied to trigger electrode 150 causes a disturbance of the electrical field within cathode cavity 122, which will cause triggering of the hollow cathode and the formation of a breakdown channel and subsequently a discharge between cathode 120 and anode 110.

An initial discharge may take place at low initial pressure (p<0.5 Torr) and high voltage (V<10 kV) conditions, for which the electron mean free path is large compared to the dimension of the anode-cathode gap, so that Townsend ionization is ineffective. Those conditions are characterized by a large electrical field strength over gas or vapor density ratio, E/N. This stage shows rather equally spaced equipotential lines having a fixed potential difference.

The ionization growth is initially dominated by events inside the hollow cathode that operates at considerable lower E/N, resulting in a smaller mean free path for the electrons. Electrons e from hollow cathode 120, and derived from a driver gas or vapor within cavity 122, are injected into the anode-cathode gap, a virtual anode being created with ongoing ionization, which virtual anode propagates from anode 110 towards hollow cathode 120, bringing the full anode potential close to the cathode. The electric field inside the hollow cavity 122 of cathode 120 is now significantly enhanced.

In the next phase, the ionization continues, leading to a rapid development of a region with high ion density inside the hollow cathode, immediately behind the cathode aperture 121. Finally, injection of an intense beam of electrons 126 from this region into the anode-cathode gap, forms the final breakdown channel. The configuration provides for a uniform pre-ionization and breakdown in the discharge volume.

When a working gas or vapor has been ejected from source 160 and a discharge has been initiated, a partially ionized, low-density and relatively cold plasma of the working gas or vapor is created in the anode-cathode gap above aperture 121. An electrical current will be flowing within the plasma from cathode 120 to anode 110, which current will induce an azimuthal magnetic field, having magnetic field strength H, around the radiation source. The azimuthal magnetic field causes the partially ionized plasma above cathode aperture 121 to compress toward central axis A.

Dynamic compression of the plasma will take place, because the pressure of the azimuthal magnetic field is much larger than the thermal plasma pressure: $H^2/8\pi \gg nkT$, in which n represents plasma particle density, k the Boltzmann constant and T the absolute temperature of the plasma. Electrical energy stored in capacitor bank 140 connected to anode 110 and cathode 120 will most efficiently be converted into energy of the kinetic implosion during the full time of the plasma compression. A homogeneously filled pinch volume with a high spatial stability is created.

At the final stage of plasma compression, i.e. plasma stagnation in the pinch volume on central axis A, the kinetic energy of the plasma is converted into thermal energy of the plasma and finally into electromagnetic radiation having a very large contribution in the XUV range.

Radiation emitted from a collapsed plasma will pass through an opening 111 in the anode 110 into a vacuum chamber 170 that is evacuated through opening 171 in a wall of the vacuum chamber. Plasma and debris particles may also escape through opening 111. A flywheel shutter 180 is present to block these particles when no XUV radiation pulse is emitted for preventing them to reach any optical elements in the radiation path of the XUV radiation to the projection system PL.

Embodiment 5

Figure 5:
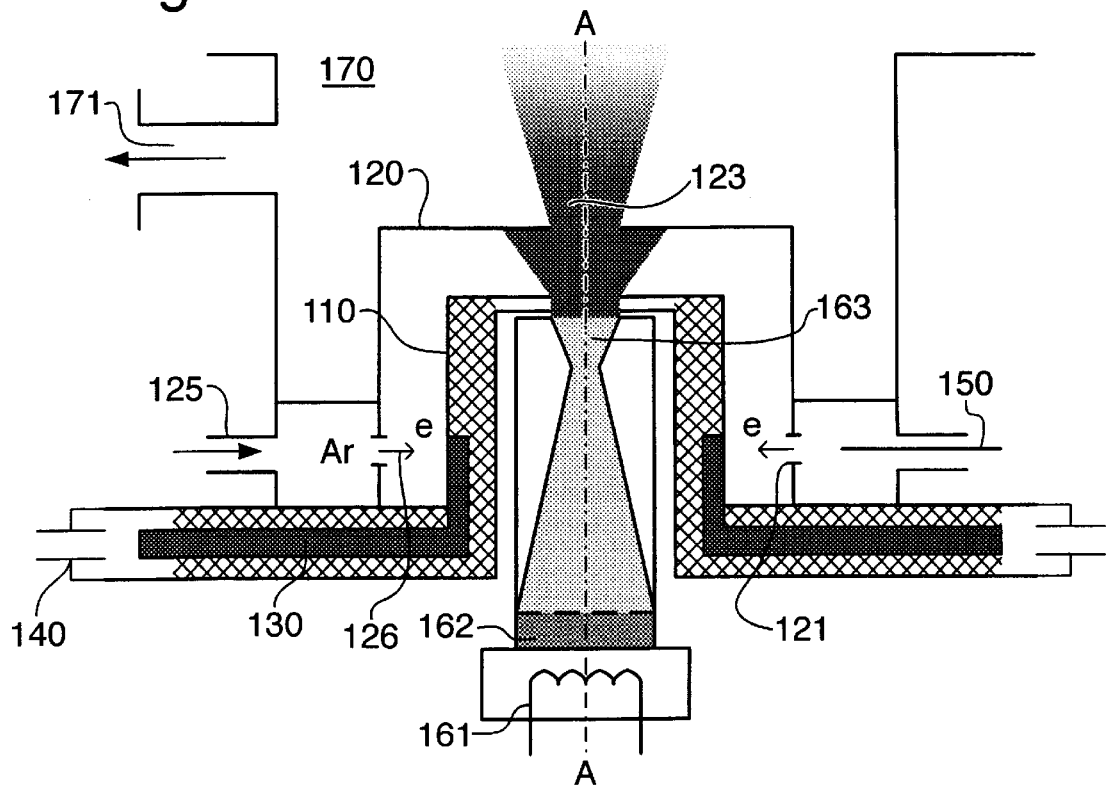
FIG. 5 depicts a radiation source according to a fifth embodiment of the invention.

FIG. 5 depicts a fifth embodiment of the invention, which is a variation of the fourth embodiment and further shields the aperture region of cathode 120 from plasma collapse at central axis A. Both anode 110 and cathode 120 have a "hat-like" structure. Annular cathode cavity 122 and aperture 121 are located at the bottom side of the hat. A partially ionized, low-density and relatively cold plasma created by a discharge at aperture 121 will compress upwards and "around the corner" towards central axis A. Further, the positions of anode 110 and cathode 120 have been interchanged. Cathode 120 is located on the outside of the configuration and comprises aperture 123 for passing XUV radiation to vacuum chamber 170.

However, the density of the working gas or vapor, also Li vapor in the present embodiment, may be too low at annular aperture 121 of cathode 120 for creating a discharge and a plasma. In embodiment 6, the radiation source is configured so as to yield a sufficiently high pressure of the driver gas or vapor, Ar in the present embodiment, within the anode-cathode gap in the region at the annular aperture 121 for creating a discharge in the driver gas. The resulting plasma of the driver gas will start to compress towards central axis A and at some point encounter a sufficiently high pressure of the working gas or vapor to create a plasma of the working gas or vapor, which will then further compress until stagnation into a pinch volume on central axis A. The plasma of the driver gas or vapor may even first have to go "around the corner" to reach a sufficiently high pressure of the working gas or vapor.

Embodiment 6

Figure 6:
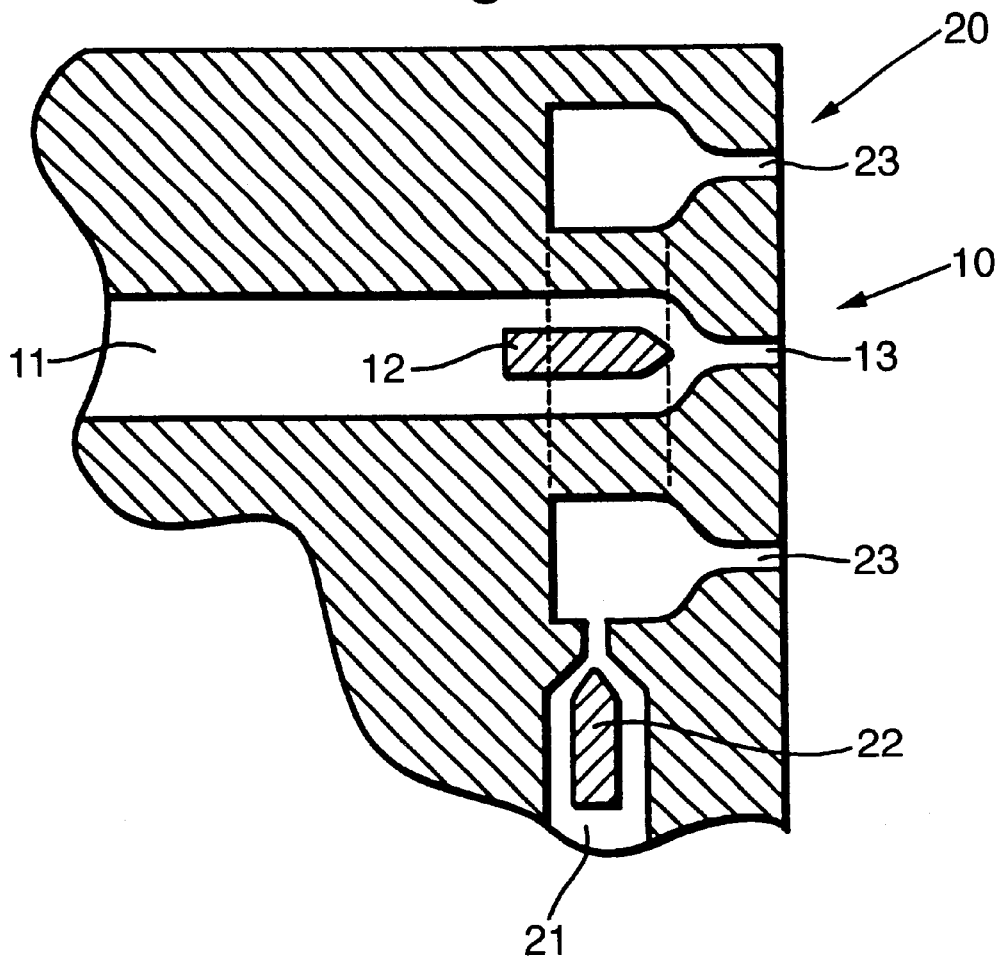
FIG. 6 depicts a longitudinal section through a pulsed jet nozzle source according to a sixth embodiment of the invention.
Figure 7:
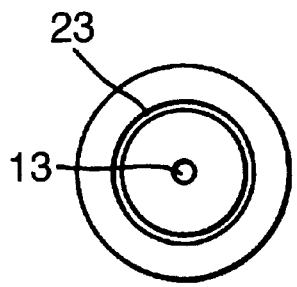
FIG. 7 depicts a front view of the nozzle source of FIG. 6.

A radiation source according to a sixth embodiment of the invention is shown schematically in FIG. 6 and 7 and comprises primary and secondary jet nozzles 10 and 20 and a supply of primary and secondary gases 11, 21 to the primary and secondary jet nozzles, respectively. In this embodiment, both jet nozzles are pulsed jet nozzles, in which both supply lines 11, 21 comprise valves which are opened at certain instants in time to supply a pulse of primary and secondary gases to the respective jet nozzles.

FIG. 6 shows a longitudinal section through the jet nozzle source for the primary and secondary gases. FIG. 7 shows a front view of the nozzle source. The primary and secondary jet nozzles are arranged co-axial, the secondary jet nozzle 20 enclosing the primary jet nozzle 10. The primary jet nozzle 10 has a circular outlet 13 and the secondary nozzle 20 has a annular outlet 23. Plungers 12 and 22 are arranged in the supply of the primary and secondary gases 11 and 21, respectively, and may be independently operated to close off their respective supply by abutting against a tapered end of the supply. In this way valves are obtained for opening and closing the respective supplies to yield a pulsed outflow of the primary and secondary gasses. However, pulsed nozzles may be obtained in various other configurations. The plungers 12, 22 are operated by means which are not shown in the drawings. Further, the use of continuous nozzles is also possible.

When a pulse of primary gas and no pulse of secondary gas is ejected from the nozzle source, the outflow of the primary gas 15 from the jet nozzle outlet 13 will be strongly divergent. Ejecting a pulse of secondary gas 25 as well results in a less divergent or even parallel or convergent outflow of the primary gas 15. An optimum outflow of the primary gas for the radiation source can be reached by varying one or more of several parameters. One of these parameters is the supply rate of secondary gas to the secondary jet nozzle 20 with respect to the supply rate of primary gas to the primary jet nozzle 10. Another parameter is the timing of the pulse of secondary gas with respect to the timing of the pulse of primary gas. It appears that an appropriately delayed pulse of primary gas with respect to the pulse of secondary gas results in a less divergent beam if the secondary gas is a lighter gas than the primary gas as compared to a non-delayed pulse at the same flow rates of primary and secondary gasses. Other relevant parameters are the backing pressures of the gases in the nozzle source and the jet geometry. The optimum parameters will depend on the gases or liquids used and on the specific geometry of the primary and secondary jet nozzles.

The primary gas of the sixth embodiment of the radiation source comprises krypton or xenon, which may be supplied pure or in a mixture with other (inert) gases. A xenon plasma, for instance, has been shown to emit a large contribution of extreme ultraviolet radiation. In an alternative embodiment water droplets or cryogenic liquids, such as liquid xenon, in a carrier gas may be used as a primary liquid. The secondary gas may be selected from the group comprising helium, neon, argon, krypton, methane, silane and hydrogen.

In the preferred embodiment the secondary gas is hydrogen, because hydrogen hardly absorbs extreme ultraviolet radiation. Since hydrogen has favorable absorption characteristics with respect to extreme ultraviolet radiation, a very large outflow of hydrogen from the secondary nozzle can be employed, resulting in a high local density in the outflow. A lighter secondary gas is expected to provide worse confinement of xenon as a primary gas with respect to a heavier secondary gas due to the smaller momentum transfer in a collision. The much larger outflow and higher pressure of hydrogen which can be employed in the radiation source according to the invention overcompensates for the smaller mass of hydrogen with respect other secondary gasses, due to the considerably larger local pressures which can be tolerated.

With the above jet nozzles a less divergent, confined or an approximate parallel outflow of the working (primary) gas from the primary jet nozzle 10 may be obtained to receive the ejected working gas in a rather confined region at the pinch volume, which is preferably located at some distance from the nozzle source outlet to not produce debris from the jet nozzle by interaction of the plasma with the nozzle. A continued ejection of secondary fluid from the annular secondary jet nozzle will provide for a gas shield around the compressed high-temperature plasma in the pinch volume to block or slow down and neutralize any fast particulates that will be emitted from the hot plasma. Parts of the source, and possibly also optical elements comprised in the illuminator of a lithographic projection apparatus, are thus protected from damage by such fast particulates or from deposition of those particulates. Further, the flushing gas shield of secondary gas also provides for an environment around the pinch volume, which is highly transparent for the generated XUV radiation when an appropriate secondary fluid is chosen. Heavy (metal) particles, for instance, eroded from the electrodes or primary Xenon (working) gas that might be present around the high-temperature plasma in the pinch volume would cause a large absorption of the XUV radiation generated.

FIG. 8 schematically shows a front view of a nozzle source used in a variant of the radiation source according to the sixth embodiment of the invention. The variant differs from the basic arrangement of the sixth embodiment in that the secondary nozzle is positioned at one side of the primary nozzle. The Figure shows the outlets 13 and 23 of the primary and secondary jet nozzles, respectively. The divergence of the outflow from the primary nozzle may for this embodiment only controlled at this one side, which may be convenient in some applications. An embodiment in which the secondary jet nozzle partly encloses the primary jet nozzle, or having, for instance, outlets of the secondary jet nozzle on opposite sides of or all around the outlet of the primary jet nozzle may also be envisaged.

Lithographic Apparatus

FIG. 9 schematically depicts a lithographic projection apparatus 1 in which the radiation sources according to the invention may be used. The apparatus comprises:
- a radiation system LA, IL for supplying a projection beam PB of EUV radiation;
- a first object table (mask table) MT provided with a first object (mask) holder for holding a mask MA (e.g. a reticle), and connected to first positioning means PM for accurately positioning the mask with respect to item PL;
- a second object table (substrate table) WT provided with a second object (substrate) holder for holding a substrate W (e.g. a resist-coated silicon wafer), and connected to second positioning means PW for accurately positioning the substrate with respect to item PL;
- a projection system ("lens") PL (e.g. a refractive, catadioptric or reflective system) for imaging an irradiated portion of the mask MA onto a target portion C (die) of the substrate W.

As here depicted, the apparatus is of a reflective type (i.e. has a reflective mask). However, in general, it may also be of a transmissive type, for example.

The radiation system comprises a source LA which may be any of the radiation sources described above and which produces a beam of extreme ultraviolet (EUV) radiation. This beam is passed along various optical components included in illumination system ("lens") IL so that the resultant beam PB is collected in such a way as to give illumination of the desired shape and intensity distribution at the entrance pupil of the projection system and the mask.

The beam PB subsequently impinges upon the mask MA which is held in the mask holder on the mask table MT. Having been selectively reflected by the mask MA, the beam PB passes through the lens PL, which focuses the beam PB onto a target area C of the substrate W. With the aid of the interferometric displacement measuring means IF and positioning means PW, the substrate table WT can be moved accurately, e.g. so as to position different target areas C in the path of the beam PB. Similarly, the positioning means PM and interferometric displacement measuring means IF can be used to accurately position the mask MA with respect to the path of the beam PB. In general, movement of the object tables MT, WT will be realized with the aid of a long stroke module (course positioning) and a short stroke module (fine positioning), which are not explicitly depicted in FIG. 9.

The depicted apparatus can be used in two different modes:
1. In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;
2. In scan mode, essentially the same scenario applies, except that a given target area C is not exposed in a single "flash". Instead, the mask table MT is movable in a given direction (the so-called "scan direction", e.g. the Y direction)

with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

What is claimed is:

1. A plasma radiation source for extreme ultraviolet electromagnetic radiation comprising:

electrodes connected to a source of high electrical potential and constructed and arranged to allow a first plasma state to compress into a pinch volume by an electrical current induced in said first plasma state and a corresponding magnetic field;

a fluid supply for a working fluid to be brought into a high-temperature plasma state to emit extreme ultraviolet electromagnetic radiation; and a primary jet nozzle constructed and arranged to inject said working fluid into said pinch volume so as to be brought into said high-temperature plasma state by compression of said first plasma state into said pinch volume.

2. A radiation source according to claim 1 wherein said working fluid is liquid.

3. A radiation source according to claim 2 wherein said jet nozzle jets said working fluid in one of a cluster jet and a droplet-like jet.

4. A radiation source according to claim 1 wherein said working fluid is selected from the group comprising Li vapor, Krypton, Xenon, water and cryogenic liquids.

5. A radiation source according to claim 1 wherein said radiation source is a plasma focus source.

6. A radiation source according to claim 1 wherein said radiation source is a Z-pinch plasma source.

7. A radiation source according to claim 1 wherein said radiation source is a capillary discharge plasma source.

8. A radiation source according to claim 5 wherein said electrodes comprise an anode and a cathode configured and arranged to create a plasma by a discharge in a driver fluid between said anode and said cathode, said cathode comprising a hollow cavity having an aperture and said aperture having a substantially annular configuration around a central axis of said radiation source.

9. A radiation source according to claim 8, wherein said cavity has a substantially annular configuration around the central axis of the radiation source.

10. A radiation source according to claim 8, wherein said working fluid is supplied in a region around said central axis in between said anode and cathode.

11. A radiation source according to claim 10, wherein said working fluid is supplied along said central axis.

12. A radiation source according to claim 1, further comprising:

a supply for a secondary fluid; and a secondary jet nozzle constructed and arranged to eject said secondary fluid parallel to and spaced from the line of ejection of said working fluid.

13. A radiation source according to claim 12, wherein said secondary jet nozzle encloses said primary jet nozzle.

14. A radiation source according to claim 13, wherein the primary and secondary jet nozzles are co-axial.

15. A radiation source according to claim 12, wherein the secondary fluid comprises at least one gas selected from the group comprising helium, neon, argon, krypton, methane, silane and hydrogen.

16. A radiation source according to claim 1, wherein said primary jet nozzle is a pulsed jet nozzle.

17. A radiation source according to claim 1, wherein said primary jet nozzle is a super-sonic jet nozzle.

18. A radiation source according to claim 1 wherein said extreme ultraviolet radiation comprises radiation having a wavelength in the range of from 8 to 20 nm.

19. A lithographic projection apparatus for imaging of a mask pattern in a mask onto a substrate, said apparatus comprising:

a radiation source constructed and arranged to generate extreme ultraviolet radiation;

an illumination system constructed and arranged to receive said extreme ultraviolet radiation and to supply a projection beam of said extreme ultraviolet radiation;

patterning means constructed and arranged to pattern the projection beam of radiation according to a desired pattern;

a substrate table constructed to hold a substrate; and a projection system constructed and arranged to image the patterned beam onto target portions of the substrate, wherein the radiation source is a radiation source according to claim 1.

20. A radiation source according to claim 1 wherein said extreme ultraviolet radiation comprises radiation having a wavelength in the range of from 9 to 16 nm.

21. A method for producing extreme ultraviolet electromagnetic radiation, comprising:

compressing a first plasma state into a pinch volume; and injecting a jet of working fluid into said pinch volume so as to bring said working fluid into a high-temperature plasma state to emit extreme ultraviolet electromagnetic radiation.

22. A device manufacturing comprising:

generating a plasma radiation by:

compressing a first plasma state into a pinch volume; and injecting a jet of working fluid into said pinch volume so as to bring said working fluid into a high-temperature plasma state to emit extreme ultraviolet electromagnetic radiation;

providing a projection beam of said plasma radiation;

providing a substrate that is at least partially covered by a layer of radiation-sensitive material to said substrate table;

patterning a projection beam from the radiation source in its cross-section according to a desired pattern; and imaging the patterned beam onto said target portions of said substrate.

23. A device manufactured in accordance with the method of claim 22.

* * * * *

UNITED STATES PATENT AND TRADEMARK OFFICE
CERTIFICATE OF CORRECTION

PATENT NO. : 6,452,194 B2
DATED : September 17, 2002
INVENTOR(S) : Bijkerk et al.

It is certified that error appears in the above-identified patent and that said Letters Patent is hereby corrected as shown below:

<u>Title page,</u>
Item [56], References Cited, please add the following U.S. PATENT DOCUMENTS:

```
-- 5,637,962 A  * 06/1997    Prono et al. ............315/111.21
   6,061,379 A  * 05/2000    Schoen  ................372/76
   6,075,838 A  * 06/2000    McGeoch ..............378/119 --
```

Signed and Sealed this

First Day of April, 2003

JAMES E. ROGAN
*Director of the United States Patent and Trademark Office*